(12) United States Patent  
Nemouchi et al.

(10) Patent No.: US 8,664,104 B2
(45) Date of Patent: Mar. 4, 2014

(54) METHOD OF PRODUCING A DEVICE WITH TRANSISTORS STRAINED BY MEANS OF AN EXTERNAL LAYER

(75) Inventors: Fabrice Nemouchi, Moirans (FR); Patrice Gergaud, La Buisse (FR); Thierry Poiroux, Voiron (FR); Bernard Previtali, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 13/591,407

(22) Filed: Aug. 22, 2012

(65) Prior Publication Data

US 2013/0214362 A1    Aug. 22, 2013

(30) Foreign Application Priority Data

Aug. 25, 2011 (FR) ....................... 11 57530

(51) Int. Cl.
*H01L 21/44* (2006.01)

(52) U.S. Cl.
USPC .......................................... 438/597; 257/369

(58) Field of Classification Search
USPC .......................................... 438/597; 257/369
See application file for complete search history.

(56) References Cited

U.S. PATENT DOCUMENTS

| | | | |
|---|---|---|---|
| 5,989,965 A | 11/1999 | Maa et al. | |
| 6,339,245 B1 | 1/2002 | Maa et al. | |
| 8,258,053 B2 * | 9/2012 | Kronholz et al. | 438/595 |
| 8,361,859 B2 * | 1/2013 | Adam et al. | 438/233 |
| 8,426,266 B2 * | 4/2013 | Hoentschel et al. | 438/231 |
| 2006/0220113 A1 | 10/2006 | Tamura et al. | |
| 2007/0066001 A1 | 3/2007 | Iinuma | |
| 2007/0099360 A1 | 5/2007 | Lee et al. | |
| 2007/0287240 A1 | 12/2007 | Hen et al. | |
| 2008/0023692 A1 * | 1/2008 | Wirbeleit et al. | 257/19 |
| 2008/0105910 A1 * | 5/2008 | Matsuki | 257/295 |
| 2008/0124858 A1 * | 5/2008 | Nguyen et al. | 438/217 |
| 2008/0191289 A1 * | 8/2008 | Pas et al. | 257/401 |
| 2008/0283941 A1 * | 11/2008 | Pas et al. | 257/412 |
| 2009/0050972 A1 | 2/2009 | Lindsay et al. | |
| 2009/0085125 A1 | 4/2009 | Kim et al. | |
| 2009/0104746 A1 | 4/2009 | Clifton et al. | |
| 2009/0142892 A1 * | 6/2009 | Lee et al. | 438/218 |
| 2009/0227079 A1 | 9/2009 | Iinuma | |
| 2010/0330757 A1 * | 12/2010 | Lenski et al. | 438/229 |
| 2011/0084320 A1 | 4/2011 | Jung | |
| 2011/0129971 A1 * | 6/2011 | Kronholz et al. | 438/230 |
| 2011/0159654 A1 | 6/2011 | Kronholz et al. | |
| 2013/0052805 A1 | 2/2013 | Previtali | |

FOREIGN PATENT DOCUMENTS

JP    11-67694 A    3/1999

OTHER PUBLICATIONS

U.S. Appl. No. 13/591,485 filed Aug. 22, 2012, Nemouchi et al.
French Preliminary Search Report Issued Mar. 22, 2012 in Patent Application No. 1157530 (with English translation of Categories of Cited Documents).

(Continued)

*Primary Examiner* — Bilkis Jahan
(74) *Attorney, Agent, or Firm* — Oblon, Spivak, McClelland, Maier & Neustadt, L.L.P.

(57) ABSTRACT

A method of producing a microelectronic device with transistors wherein a strain layer is formed on a series of transistors and the strain exerted on at least one given transistor of said series is released by removing a sacrificial layer situated between said given transistor and said strain layer.

14 Claims, 11 Drawing Sheets

(56) References Cited

OTHER PUBLICATIONS

"Applying Mechanical Stress to Improve MOS Semiconductor Performance", IBM Technical Disclosure Bulletin, XP000104874, vol. 30, No. 9, Feb. 1988, pp. 330-333.

An Steegen et al., "Silicide-induced stress in Si: origin and consequences for MOS technologies", Materials Science and Engineering, vol. 38, 2002, pp. 1-53.

G. Lucadamo et al., "Stress evolution in polycrystalline thin film reactions", Thin Solid Films, vol. 389, 2001, pp. 8-11.

O.B. Loopstra et al., "Model for stress and volume changes of a thin film on a substrate upon annealing: Application to amorphous Mo/Si multilayers", Physical Review B, vol. 44, No. 24, Dec. 15, 1991, pp. 519-533.

F.M. d'Heurle et al., "Stresses during Silicide Formation: A Review", Defect and Diffusion Forum, vols. 129-130, 1996, pp. 137-150 with cover page.

Oliver Thomas et al., "Stress Development During the Reactive Formation of Silicide Films", Defect and Diffusion Forum, vols. 237-240, 2005, pp. 801-812 with cover page.

P. Gergaud et al., "Influence of Si substrate orientation on stress development in Pd silicide films grown by solid-state reaction", Applied Physics Letters, vol. 83, No. 7, Aug. 18, 2003, pp. 1334-1336 with cover page.

P. Gergaud et al., "Stresses arising from a solid state reaction between palladium films and Si(001) investigated by in situ combined x-ray diffraction and curvature measurements", Journal of Applied Physics, vol. 94, No. 3, Aug. 1, 2003, pp. 1584-1591 with cover page.

S.-L. Zhang et al., "Stressed from solid state reactions: a simple model, silicides", Thin Solid Films, vol. 213, 1992, pp. 34-39 with cover page.

* cited by examiner

METHOD OF PRODUCING A DEVICE WITH TRANSISTORS STRAINED BY MEANS OF AN EXTERNAL LAYER

TECHNICAL FIELD

The present application relates to the field of microelectronic devices with transistors, and in particular that of strained channel transistors.

The invention provides for a method of producing a device with transistors wherein certain transistors are strained particularly by means of an external layer.

The invention may be applied in particular in the production of transistors of size less than 22 nm.

PRIOR ART

The current performance of field effect transistors is linked in particular to the mobility of the charge carriers in the channel area, the charge carriers being electrons for N type transistors and holes for P type transistors.

In the channel of a transistor, the speed of displacement of the charge carriers may be improved by straining the latter. Applying a strain makes it possible to achieve a distortion of the crystalline lattice of the semi-conductor material and to modify its band structure and in particular the charge transport properties.

When a channel is compressive strained, this favours the displacement of holes in the latter whereas when a channel is tensile strained, it is the electrons whose displacement is favoured.

To obtain a gain in performance of PMOS transistors, it is generally sought to compressive strain them, where a gain in performance of NMOS transistors is obtained by applying a tensile strain on their channels.

Different methods exist for inducing a state of strain in the channel of a transistor.

It is known to apply a strain on the channel of transistors by depositing a strain layer, provided to apply a given type of strain, for example a tensile strain, on the source and drain areas as well as on the gate of the latter.

However, in the case where a device is produced comprising transistors of different types, for example both PMOS type transistors and NMOS type transistors, the strain is applied by the external layer indifferently on all the transistors, which can adversely affect the operation of certain transistors, for example PMOS transistors when said external layer is provided to apply a tensile strain.

The documents US 2007/0099360 A1 and US 2007/0287240 A1 disclose methods of producing strained channel transistors by means of a layer of silicon nitride 11 that is deposited on the source 2 and drain 4 areas as well as on the gate 6 of the transistor (FIGS. 1A and 1B).

The strain layer based on silicon nitride 11 may be conserved on the gate 6 (FIG. 1A) or removed from above the gate 6 so as to only be in contact with the spacers 14 formed on the sides of the gate (FIG. 1B).

To make it possible to form a device provided both with tensile strained transistors and compressive strained the transistors, a first layer of silicon nitride 9 intended to tensile strain all the transistors, is firstly formed.

Said first layer of silicon nitride 9 is covered with an etching stop layer 10, then is removed by etching above the transistors that it is wished to compressive strain. A second layer of silicon nitride 11 intended to compressive strain, is then deposited. Said second layer 11, is then removed from all of the transistors that it is wished to tensile strain, by etching with stoppage on the stop layer 10 (FIG. 1A).

It is also known to form transistors with channel strained by an underlying layer.

The document US 2009/0085125A1 discloses a device provided with a transistor, the channel 20 of which is strained by an underlying layer of material 21 (FIG. 1C). Such a material 21 may for example be based on SiGe on which a channel of Si has been made to grow. In this case, it is possible to obtain a compressive strained channel 20 to form a PMOS transistor.

The device comprises another transistor, the channel 30 of which is strained by another underlying layer of material 31. Such a material 31 may be for example based on SiC on which has been grown a Si channel. In this case, it is possible to obtain a tensile strained channel 30 to produce a NMOS transistor (FIG. 1C).

Such a method requires numerous steps of photolithography, etchings as well as depositions by epitaxy to implement such a device.

The problem is posed of finding a novel method of producing a microelectronic device with transistors provided with a strained channel.

DESCRIPTION OF THE INVENTION

The present invention relates to a method of producing a microelectronic device with transistors comprising steps of:

a) forming a strain layer on a first gate block of a transistor of a first type, in particular of PMOS or NMOS type, and on first semi-conductor areas situated on either side of said first gate block, as well as on a second gate block of a second transistor of a second type, different to the first type, in particular of NMOS or PMOS type, and on second semi-conductor areas situated on either side of said second gate block, a sacrificial layer being provided between said strain layer and said second semi-conductor areas of the transistor of the second type, b) forming openings traversing the strain layer among which one or more given openings exposing the sacrificial layer, c) removing the sacrificial layer by etching through said openings.

Thus, a strain layer is formed on a series of transistors of the device and the strain exerted on at least one given transistor of said series is released by removing a sacrificial layer situated between said given transistor and said strain layer. In this way, the strain layer and the given transistor are separated.

With such a method, it is thus possible to strain transistors of a given type by means of an external strain layer, and release said strain from the transistors of another type while conserving said layer which can also fulfil other functions, for example serve as etching stop layer and/or insulation layer.

According to an implementation possibility, among the openings formed at step b) may feature one or more openings exposing the first semi-conductor areas.

Thus, at the same time as the sacrificial layer is exposed, the first semi-conductor areas are exposed, which can, for example, make it possible subsequently to carry out a silicidation and/or form contact areas on the first semi-conductor areas.

The method may moreover comprise, after step c), depositing a metallic material through said openings, followed by an annealing, so as to form areas of alloy of metal and semi-conductor, in particular silicided areas in a case where the first and the second semi-conductor areas are based on silicon.

Said silicidation step is carried out after the opening of the contacts which makes it possible to shift the thermal budgets of the silicidation to the step of the formation of contacts.

During said deposition of metallic material, the type of metallic material deposited, the volume of metallic material deposited on the first semi-conductor areas, as well as the duration of the annealing are chosen so as to form first areas of alloy of metal and semi-conductor exerting a compressive strain, in particular on a channel area of said transistor of the first type.

The removal of the sacrificial layer by etching through said given openings can lead to the formation of cavities between said second semi-conductor areas and said strain layer, said metallic deposition and said annealing being carried out so as to form second areas of alloy of metal and semi-conductor partially filling said cavities, a space being conserved between said second areas of alloy of metal and semi-conductor and said strain layer.

Thus, it is possible to silicide the first and second semi-conductor areas, without straining or by limiting a strain on the channel area of the transistor of the second type resulting from said silicidation.

According to an implementation possibility, the first gate block and the second gate block may rest on a semi-conductor layer, the first semi-conductor areas and/or the second semi-conductor areas being formed by growth on said semi-conductor layer.

It is also possible to carry out prior to said growth: a thinning of said semi-conductor layer in areas situated on either side of said first gate block and/or of said second gate block.

This makes it possible to obtain, once the growth carried out, first semi-conductor areas in contact with an area of the semi-conductor layer intended to form a channel of the transistor of the first type and/or second semi-conductor areas in contact with an area of the semi-conductor layer intended to form a channel of the transistor of the second type.

According to an implementation possibility of the method, the first semi-conductor areas may be formed of a semi-conductor material provided to compressive strain said semi-conductor layer on which rests said first gate block. The first semi-conductor areas may be formed for example based on SiGe, in particular when the semi-conductor layer is based on Si.

In the case where a thinning of said semi-conductor layer has been carried out beforehand, a compressive strain may be exerted on the channel area on which the first gate block rests.

According to an implementation possibility of the method, the second semi-conductor areas may be formed of a semi-conductor material provided to tensile strain said semi-conductor layer on which said second gate block rests. The second semi-conductor areas may be formed for example based on SiC in particular when the semi-conductor layer is based on Si.

In the case where a thinning of said semi-conductor layer has been carried out beforehand, a tensile strain may be exerted on the channel area on which the second gate block rests.

Prior to step a), insulating spacers may be formed against said first gate block and said second gate block. In this case said strain layer may rest on said spacers.

According to a possibility, the strain layer may be separated from said second semi-conductor areas by an etching stop layer.

In this case, the removal at step c) of the sacrificial layer by etching through said given openings may be carried out until reaching said etching stop layer.

The strain layer may be based on a dielectric material such as silicon nitride $Si_xN_y$.

According to an implementation possibility, the method may comprise between step a) and step b), the steps of:
  depositing at least one insulating layer on the strain layer,
    forming holes traversing said insulating layer and exposing said strain layer by selective etching of said insulating layer vis-à-vis said strain layer.

According to an implementation possibility, the first gate block and/or said second gate block may be sacrificial and based on at least one sacrificial material intended to be removed. In this case, the method moreover comprises, after step c), the steps of:
  removing the strain layer on said first gate block and/or on said second gate block so as to expose said sacrificial material,
  removing said sacrificial material,
  replacing said sacrificial material by at least one other gate material.

The present invention also provides for a device obtained by means of a method as defined above.

The present invention also provides for a microelectronic device with transistors comprising:
  a first transistor provided with first semi-conductor areas situated on either side of a first gate block, a strain layer laid out on and in contact with the first gate block and on the first semi-conductor areas so as to exert a given mechanical strain on the first transistor,
  a second transistor provided with second semi-conductor areas situated on either side of a second gate block, the strain layer being laid out above the second gate block and the second semi-conductor areas and being disjointed from the second semi-conductor areas.

Thus, the strain layer does not exert strain on the second semi-conductor areas of the second transistor or a strain below the given mechanical strain.

BRIEF DESCRIPTION OF DRAWINGS

The present invention will be better understood on reading the description of embodiment examples given purely for indicative purposes and in no way limiting and by referring to the appended drawings, in which.

Figure 1A:
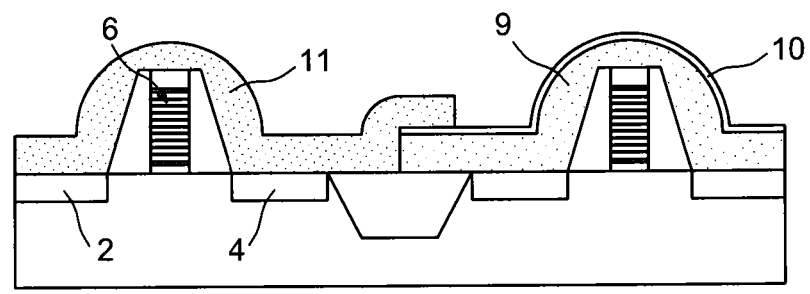
FIGS. 1A-1C give examples of microelectronic devices with transistors according to the prior art provided with PMOS and NMOS transistors, respectively compressive and tensile strained.
Figure 1B:
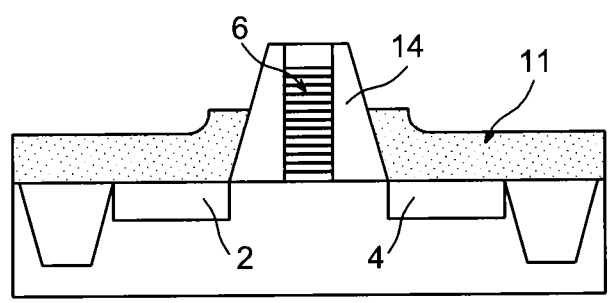
Figure 1C:
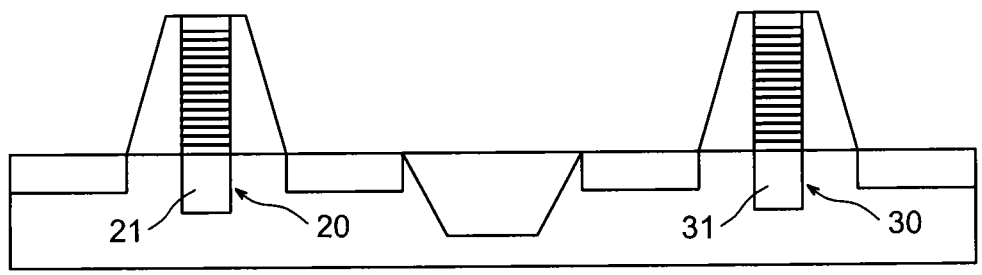

The different parts represented in the figures are not necessarily shown according to a uniform scale in order to make the figures easier to read.

DETAILED DESCRIPTION OF PARTICULAR EMBODIMENTS

An example of method according to the invention of producing a microelectronic device with transistors, the channel of which is strained, will now be described with reference to FIGS. 2A-2K.

The starting material may be a substrate 100, for example of SOI type (SOI for Silicon On Insulator) formed of a layer of semi-conductor support 101, of an insulating layer 102 covering the support layer 101 and of a thin semi-conductor layer 103 on the insulating layer 102. The insulating layer 102 of the substrate 100 may be for example an ultra thin buried silicon oxide or UTBox (Ultra Thin Buried oxide) of a thickness comprised for example between 5 nm and 145 nm.

On the support 100, a first gate 108a of a transistor T1 of a first type, for example of PMOS type resting on a first region 103a of the thin semi-conductor layer 103 as well as a second gate 108b of a transistor of a second type, for example of NMOS type, resting on a second region 103b of the thin semi-conductor layer 103, are formed.

Figure 2A:
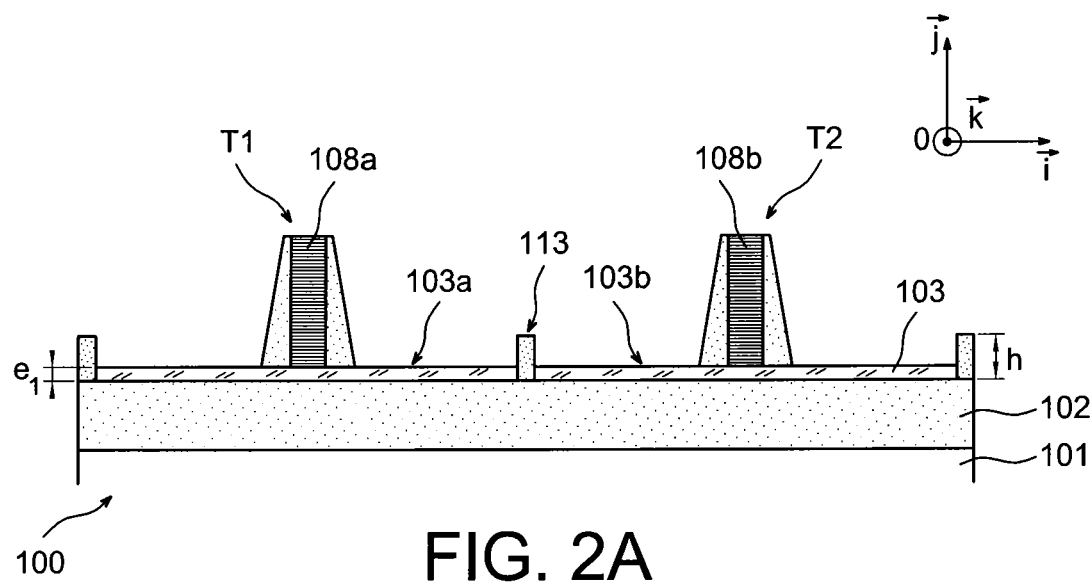
FIGS. 2A-2K illustrate an example of method according to the invention of microelectronic devices with compressive and tensile strained transistors.

Insulation areas 113 of STI type (STI for Shallow Trench Isolation) may also be provided between the transistors T1 and T2, in order to electrically insulate the latter from each other (FIG. 2A).

Said STI insulation areas 113 may be provided so as to exceed the thickness of the thin semi-conductor layer 103. The thin semi-conductor layer 103 may be provided with a thickness $e_1$ (measured in FIG. 2B in a direction parallel to the vector $\vec{j}$ of the orthogonal reference point [O; $\vec{i}$; $\vec{j}$; $\vec{k}$]) comprised for example between 5 nm and 50 nm and preferentially between 5 nm and 10 nm, whereas the STI insulation areas 113 may be provided with a height h (also measured in FIG. 2B in a direction parallel to the vector $\vec{j}$) comprised for example between 10 nm and 100 nm.

The STI insulation areas 113 may be provided so as to exceed the thickness of the thin semi-conductor layer 103 of a predetermined thickness $E=h-e1$, provided in particular as a function of those of semi-conductor areas intended to be formed subsequently and provided to form source and drain regions of the transistors T1 and T2.

Then, it is optionally possible to remove portions of the second region 103b on either side of the second gate 108b, so as to thin the second semi-conductor region 103b of the semi-conductor layer 103 in areas 104, 105, intended to form a source and a drain of the second transistor T2. After thinning, the sides of a channel area situated under the gate 108b are exposed.

To do this, a step of depositing a masking layer, for example a layer of hard mask based on silicon nitride, then of photolithography and etching, may be provided to form a hard mask 111 covering the first gate 108a as well as the first semi-conductor region 103a, whereas the second gate 108b and the second semi-conductor region 103b are exposed.

Figure 2B:
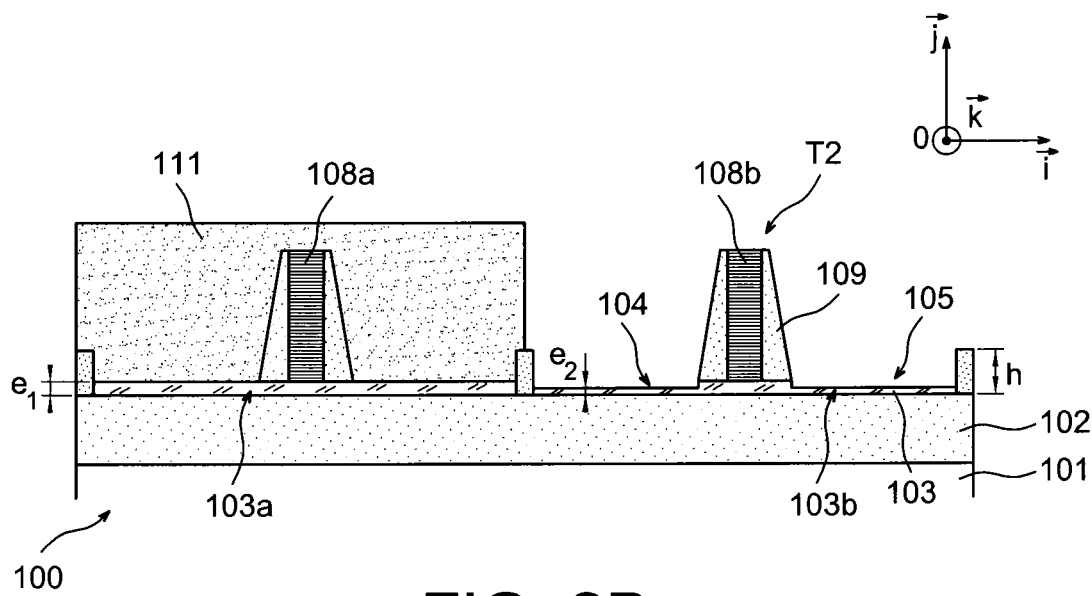

The thinning of the areas 104, 105 of the second semi-conductor region 103b may be carried out for example by etching. Said thinning may be carried out so as to conserve a thickness comprised for example between 3 nm and 10 nm of semi-conductor material. During the thinning of the second semi-conductor region 103b, the channel area situated under the second gate 108b may be protected by a gate dielectric area, as well as by insulating spacers 109 placed against the second gate 108b. It is thus possible to conserve a thickness e1 for the channel area greater than that e2 of the areas 104, 105 of the semi-conductor region 103b intended to belong, respectively, to a source area and to a drain area of the second transistor T2 (FIG. 2B).

Figure 2C:
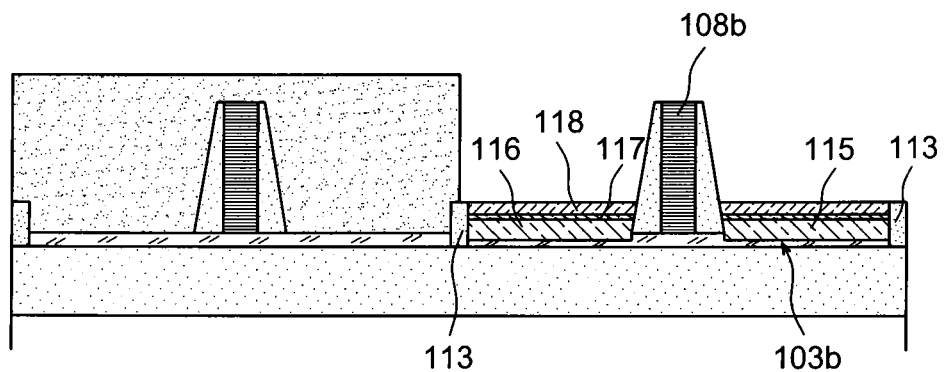

Then, semi-conductor areas 115, 116 are formed on the second semi-conductor region 103b, on either side of the gate (FIG. 2C).

Said semi-conductor areas 115, 116 may be formed by epitaxial growth.

The semi-conductor material of the areas 115, 116 may be chosen so as to have a lattice parameter less than that of the semi-conductor material of the second semi-conductor region 103b. In this case, the semi-conductor areas 115, 116 formed exert a strain on the semi-conductor area 103b, in particular a tensile strain on the channel area of the transistor T2.

When the semi-conductor material of the semi-conductor layer 103 is silicon, the material of the semi-conductor areas 115, 116 may be for example SiC, the thickness of which may be comprised for example between 5 nm and 30 nm.

Then, an etching stop layer 117 is deposited on the semi-conductor areas 115, 116. Said stop layer 117 may be formed for example based on SiGe according to a thickness for example of the order of 1 nm.

A sacrificial layer 118 is then formed. The material of the sacrificial layer 118 may be a material chosen so as to be able to be selectively etched vis-à-vis that of a layer known as "strain" layer, intended to be formed subsequently.

The sacrificial layer 118 may also be formed with a thickness predetermined as a function of a silicidation step intended to be carried out subsequently. The sacrificial layer 118 may for example be formed by epitaxy. The sacrificial layer 118 may be based on Si according to a thickness for example comprised between 5 nm and 10 nm (FIG. 2C).

According to an implementation possibility, the cumulated thickness of each semi-conductor area 115, 116, of the etching stop layer 117 and of the sacrificial layer 118 may be provided so that the top of the insulation areas and an exposed face of the sacrificial layer 117 are at the same height or substantially at the same height.

The hard mask 111 may then be removed.

Then, a step of deposition of a masking layer, for example a layer of hard mask based on silicon nitride, then photolithography and etching, may be provided to form another hard mask 121 covering the second gate 108b as well as the semi-conductor areas 115, 116, whereas the first gate 108a and the first semi-conductor region 103a are exposed.

Figure 2D:
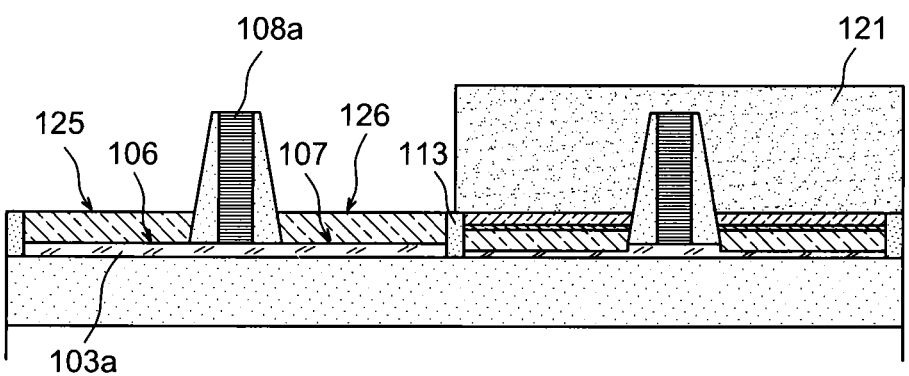

A step of thinning of areas 106, 107 of the first semi-conductor region 103a situated on either side of the gate 108a of the first transistor T1 may also be carried out (said step not being represented in FIG. 2D).

Then, semi-conductor areas 125, 126 are formed on the first semi-conductor region 103a. Said semi-conductor areas 125, 126 may be formed by epitaxy, with a thickness comprised for example between 5 nm and 30 nm.

The material of the areas 125, 126 may be a semi-conductor chosen so as to have a lattice parameter greater than that of the semi-conductor material of the first semi-conductor region 103a (FIG. 2D).

In this case, the semi-conductor areas 125, 126 exert a compressive strain on the semi-conductor region 103a, and in particular on the channel area of the transistor T1.

When the semi-conductor material of the semi-conductor layer 103 is silicon, the material of the semi-conductor areas 125, 126 may be for example SiGe, the thickness of which may be comprised for example between 5 nm and 30 nm.

Said other hard mask 121 is then removed.

Then, a layer 130 known as "strain" layer is formed, provided to exert a strain on the channel of certain transistors of the device. The strain layer 130 may be provided in particular to exert a strain on the channel of transistors of a given type, for example on the first transistor T1 of PMOS type.

Said strain layer 130 may be based on a silicon nitride $Si_xN_y$ formed by deposition.

According to the ratio of the precursors chosen, it is possible to modify the stoichiometry of the silicon nitride. The silicon nitride is generally deposited by CVD (Chemical Vapour deposition) by using two precursors: silane ($SiH_4$) and nitrogen ($N_2$). During the deposition of said layer, the compressive or tensile strain may be modulated with the stoichiometry of the silicon nitride, thus the ratio of the precursors, and this can be done for a given temperature, typically between 400° C. and 550° C. When said layer is intended to exert a compressive strain, in particular for the first transistor of PMOS type, the silicon nitride is richer in nitrogen. Conversely, when said layer is intended to exert a tensile strain, in particular for the second transistor of NMOS type, the silicon nitride is richer in silicon.

During the deposition of the strain layer, the precursor as well as the deposition temperature may be adapted to form either a strain layer based on a given silicon nitride intended to exert a compressive strain, in particular when the first transistor is of PMOS type, or instead form a strain layer based on another silicon nitride and intended to exert a tensile strain, in particular when the first transistor is of NMOS type. The strain layer 130 may have a thickness for example comprised between 5 and 50 nm and for example of the order of 20 nm.

Said strain layer 130 may also be provided to play the role of etching stop layer for at least one etching step intended to be carried out subsequently.

The strain layer 130 may be deposited in a uniform manner on the series of transistors T1 and T2 and to cover the gates 108a, 108b as well as the semi-conductor areas 125, 126, 115, 116 formed on each side of the gates 108a, 108b.

Figure 2E:
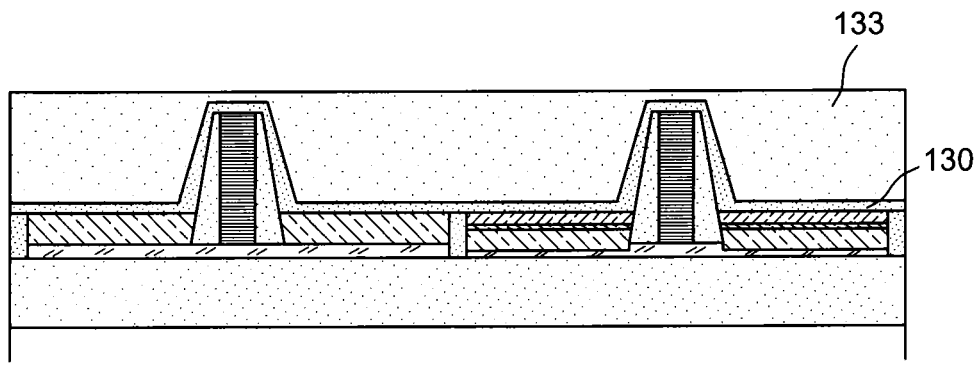

Then, a layer of dielectric material 133 is formed so as to cover the gates 108a, 108b. It is then possible to level said layer of dielectric material 133, for example by a chemical mechanical polishing method. The dielectric material 133 may be chosen so as to be able to selectively etch vis-à-vis that of the strain layer 130. The dielectric material 133 may be for example $SiO_2$ when the strain layer is based on a silicon nitride such as $Si_3N_4$ (FIG. 2E).

Openings 141, 143, 145, 147 are then formed, traversing the layers 130 and 133, and which are intended to accommodate source and drain contact pads of the first transistor T1 and of the second transistor T2. This may be carried out by selective etching of the layer of dielectric material 133 with stoppage on the strain layer 130.

Then, the openings 141, 143, 145, 147 are extended, by carrying out an etching of the strain layer 130, with stoppage on the sacrificial layer 117, or optionally on the etching stop layer 118.

The sacrificial layer 117 is also removed. The removal of the sacrificial layer 117 may be carried out for example by etching by means of a TMAH solution.

Figure 2F:
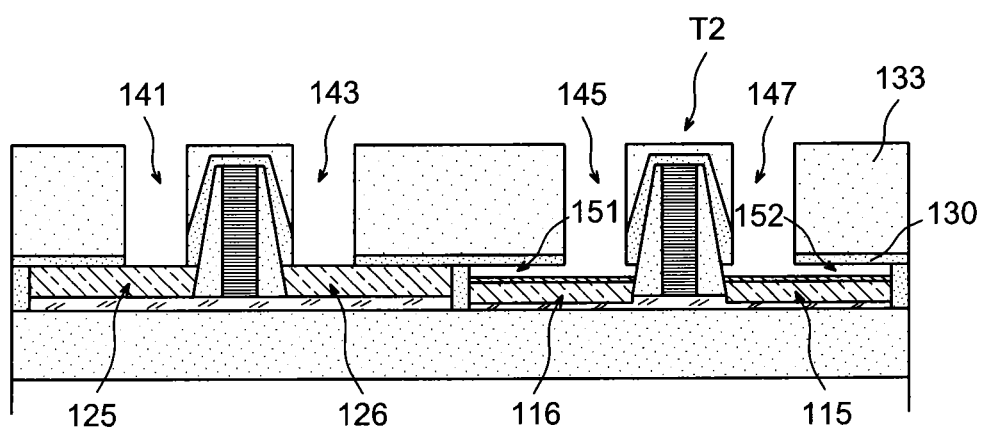

Said removal leads to the formation of cavities 151, 152 between the strain layer 130 and the semi-conductor areas 115, 116 of the second transistor T2. The volume of said cavities 151, 152, which depends in particular on the thickness of the sacrificial layer, may be provided as a function of a silicidation step intended to be carried out subsequently. The removal of the sacrificial layer 118 enables a relaxation of the strain that was exerted by the strain layer 130 on the second transistor T2 of NMOS type (FIG. 2F).

The sacrificial layer 118 may be for example based on Si whereas the stop layer may be based on SixGey. It is in this case possible to etch said sacrificial layer 118 by means of a solution based on TMAH, for example a solution containing 25% of TMAH in order to obtain a selectivity of the order of 30 between the silicon and the $Si_{0.7}Ge_{0.3}$ of the stop layer 117. Thus, with such a selectivity, the removal of a Si sacrificial layer 118 of a thickness for example of the order of 30 nm brings about a consumption of $Si_{0.7}Ge_{0.3}$ of the stop layer 117 of at the most 1 nm.

The etching stop layer 117 may be removed then by selective etching vis-à-vis the material of the semi-conductor areas 125 and 126, and the strain layer 130. Such a selective etching makes it possible to not consume the semi-conductor material of the semi-conductor areas 125 and 126 intended to form source and drain areas of the second transistor T2.

Figure 2G:
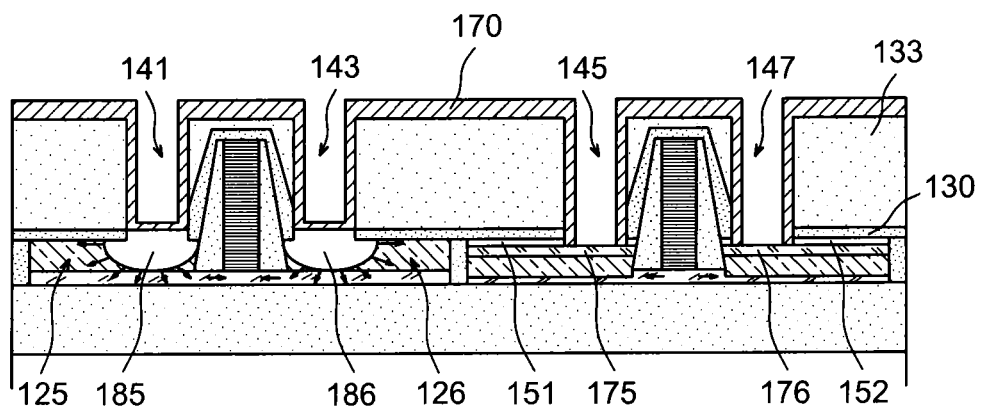

A silicidation is then carried out of the semi-conductor areas 115 and 116 exposed by the openings 145, 147, formed on either side of the gate 108b of the second transistor T2, as well as semi-conductor areas 125 and 126 exposed by the openings 141, 143 formed on either side of the gate 108a of the first transistor T1 (FIG. 2G).

Said silicidation may be carried out by deposition of a metallic material 170 reacting with the respective semi-conductor material of the semi-conductor areas 115, 116 on the one hand and 125 and 126 on the other hand.

The metallic material 170 may be constituted of a metal or of an alloy of metals chosen from one or more transition metals or the following rare earths: nickel, palladium, platinum, titanium, cobalt, erbium, ytterbium, may be implemented. The deposition may be non conformal, so that the maximum thickness of material deposited is located on the surface on areas parallel to the principal plane of the substrate 100 (defined as in FIG. 2B in a direction parallel to the vector $\vec{j}$ of the orthogonal reference point [O; $\vec{i}$; $\vec{j}$; $\vec{k}$]) and at the bottom of the openings 141, 143, 145, 147, whereas the thickness of deposited material is minimal on the walls of the openings 141, 143, 145, 147. The deposition may be for example of PVD type (Physical Vapour Deposition), according to a thickness of metal which may be comprised for example between 1 nm and 10 nm, for example of the order of 5 nm.

At the level of the second transistor T2, the metallic material 170 may be deposited in the openings 145, 147 so as to only partially fill the cavities 151, 152.

One or more silicidation annealings may then be carried out by a rapid annealing method (commonly known as "rapid thermal process" or RT) at a temperature comprised for example between 200° C. and 800° C. and for example preferentially between 350° C. and 450° C. leading to the reaction between the silicon and the metal forming a silicide (FIG. 2G).

During the silicidation, areas of silicide 175, 176, 185, 186, may form either in the metal deposited by diffusion of the semi-conductor material or in the semi-conductor material by diffusion of the metal at the interface between the metallic material and the areas 175, 176, 185, 186, of semi-conductor/metal alloy or between areas 175, 176, 185, 186, of semi-conductor/metal alloy and semi-conductor material, a volume increase occurs.

This leads to, at the bottom of the openings 141, 143, formed on either side of the gate 108a of the first transistor T1, the appearance of compressive strains at the level of the areas 185, 186 of metal/semi-conductor alloy. The areas 185, 186 of metal/semi-conductor alloy may exert a strain at the level of the areas intended to play the role of sources and drains of the first transistor T1 and spacers that are affected and at the level of the channel. The presence of a layer on the semi-conductor areas 125, 126 based on a material that is not semi-conductor, for example an insulating material, makes it possible to maintain the strain formed by silicidation.

Silicided areas 175, 176 are also formed at the level of the semi-conductor areas intended to play the role of sources and drains of the second transistor T2 of NMOS type.

Despite a volume increase of the silicided areas 175, 176, the cavities 151, 152 previously formed by etching of the sacrificial layer 117 are provided so that, after silicidation, a remaining space 161 is maintained between the silicided areas 175, 176 and the strain layer 130. Compressive strains on the channel area of the second transistor T2 of NMOS type (FIG. 2G) are thus limited or even prevented.

A strain greater than −2 GPa may be implemented on the first transistor T1.

In the case, for example, where a silicide based on $Pd_2Si$ is formed, the volume variation between the silicide and the silicon may be of the order of 209%, which may induce a triaxial strain of −50 GPa.

For given volumes of semi-conductor material and metallic material deposited, a maximal strain may be attained when all the metallic material 170 deposited has been consumed.

A relaxation of the strain may be provided and modulated as a function of the time provided for the annealing.

It is thus possible to control the level of strain at the level of the silicided areas 185, 186 particularly by adjusting the annealing time or/and the annealing temperature. This level of strain also depends on the type of metallic material 170 as well as the respective volumes of semi-conductor material of the areas 125, 126 and the metallic material 170 deposited.

The table below gives volume variations during a silicidation reaction in the solid state with volumes normalised per unit of metal.

| Metal | Silicon | Silicide | Silicide/ (metal + silicon) | Silicide/least mobile species |
|---|---|---|---|---|
| Ti | 2 Si | $TiSi_2$ | 0.77 | $TiSi_2/Ti$ |
| 1.00 | 2.24 | 2.50 | | 2.50 |
| 2 Pd | Si | $Pd_2Si$ | 0.84 | Pd2Si/Si |
| 1.00 | 0.68 | 1.42 | | 2.09 |
| Pt | Si | PtSi | 0.84 | PtSi/Si |
| 1.00 | 1.35 | 1.98 | | 1.49 |
| 2 Co | Si | $Co_2Si$ | 0.77 | Co2Si/Si |
| 1.00 | 0.91 | 1.47 | | 1.47 |
| Ni | Si | NiSi | 0.77 | NiSi/Si |
| 1.00 | 1.83 | 2.18 | | 1.20 |
| Ni | Si | $NiSi_2$ | 0.76 | NiSi2/Si |
| 1.00 | 3.66 | 3.59 | | 0.99 |
| Ta | 2 Si | $TaSi_2$ | 0.75 | $TaSi_2/Ta$ |
| 1.00 | 2.21 | 2.40 | | |
| Mo | 2Si | $MoSi_2$ | 0.73 | $MoSi_2/Mo$ |
| 1.00 | 2.57 | 2.60 | | |
| W | 2 Si | $WSi_2$ | 0.73 | $WSi_2/W$ |
| 1.00 | 2.52 | 2.58 | | |

The choice of the metallic material 170 deposited and of the silicide that it is wished to form, may be also made for example according to the application provided for the device with transistors, and/or as a function of the technology node, in other words the size provided for the transistors of the device.

For example, for technology node C0=45 nm and C0=32 nm, it may be chosen to form silicided areas of PtSi and NiSi, even if, among the silicides listed in the table given above the change of volume that they cause and thus the strain that they are capable of inducing is not necessarily the most important.

The choice of the metallic material 170 as well as the silicide that are formed may also depend on the difficulties of implementation of the method of production, for example steps of associated heat treatments, cleaning, etching to implement.

The choice of the metallic material 170 may also be made according to a mechanical criterion, in other words as a function of the intensity of the strain that it is wished to exert on the areas 185, 186.

The formation of a silicide by reaction between the metallic material 170 and the silicon leads to a different silicon consumption according to the metallic material 170 deposited. The thickness of the metallic material 170 may thus be provided as a function of said consumption.

As has been indicated previously, by adjusting the annealing time, it is possible to adjust the relaxation of the silicide formed.

Once the silicided areas 175, 176, 185, 186 have been formed, it is possible to carry out a selective removal of the metal that has not reacted.

Figure 2H:
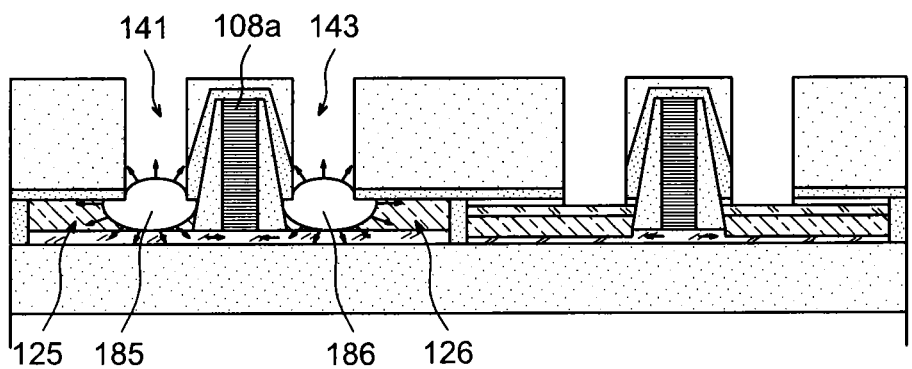

The case of a selective removal is illustrated in FIG. 2H. The excess metal is selectively removed by immersion in a heated chemical, the composition, the concentrations and the temperature of which are chosen as a function of the metal deposited previously.

The immersion time is adjusted in order to enable the solution to access metal at the bottom of the openings 141, 143, 145, 147. For example, when the metal deposited is Ni, the solution used may be for example based on $H_2SO_4$ and $H_2O_2$.

A diffusion barrier layer 190 may then be deposited. Said diffusion barrier layer 190 may for example be based on TiN or TaN and have a thickness comprised for example between 1 nm and 10 nm.

Figure 2I:
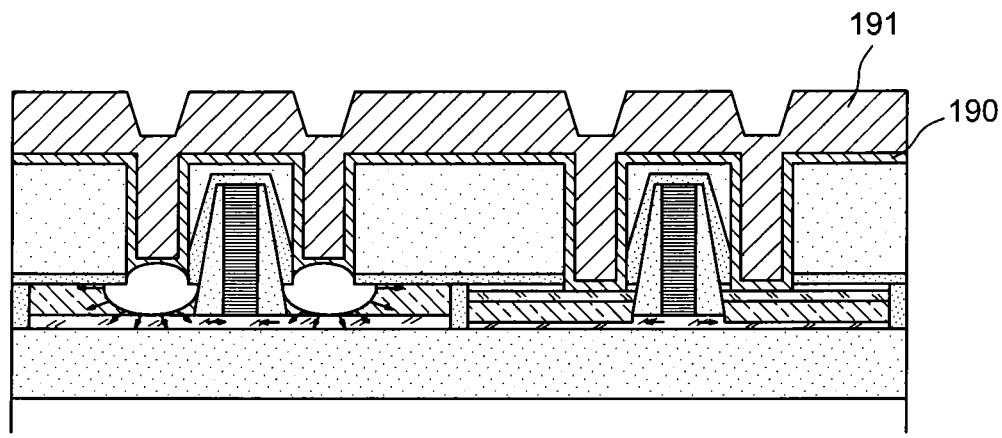
Figure 2J:
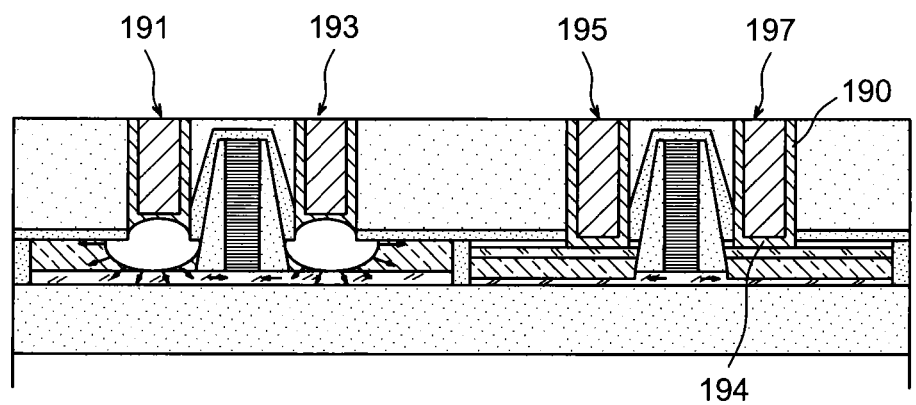

A deposition of a metallic material 194 is then carried out so as to fill the openings 141, 143, 145, 147. Said metallic material 194 may for example be tungsten, or copper (FIG. 2I).

Metallic material 194 in excess as well as the barrier layer 190 are then removed during steps of chemical mechanical polishing with a stoppage on the layer of dielectric material 133. This makes it possible to form contact pads 191, 193, 195, 197 (FIG. 2J) which may be provided to connect the transistors T1, T2 with one or more interconnection levels.

Figure 2K:
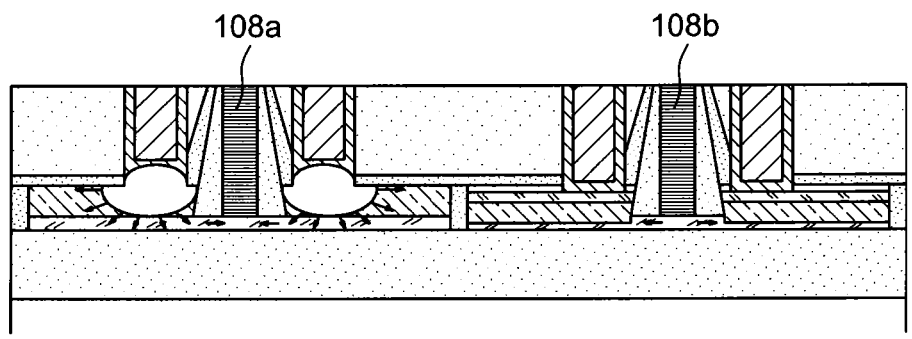

According to an implementation possibility, the method may moreover comprise a step consisting in exposing the top of the gate 108a of the first transistor T1 as well as that of the gate 108b of the second transistor T2 (FIG. 2K).

An access to the gates 108a, 108b is thus produced. It is then possible to form one or more interconnection levels over the top of the transistors T1 and T2.

Figure 3A:
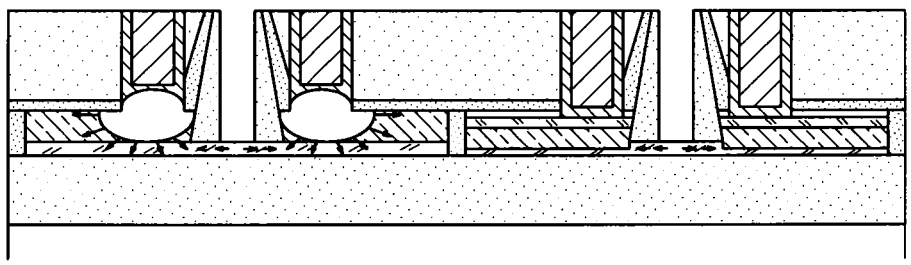
FIGS. 3A-3B illustrate a variant of method during which sacrificial gates are formed then said sacrificial gates are replaced by a gate material.
Figure 3B:
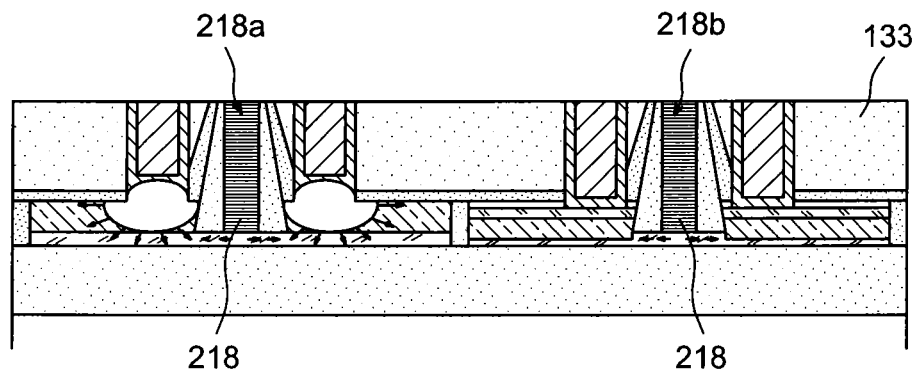

According to a variant illustrated in FIGS. 3A and 3B, once the steps described previously have been carried out, it is then possible to remove the gates 108a and 108b which, in this case, have played the role of sacrificial gates or dummy gates (FIG. 3A). Said sacrificial or dummy gates are then replaced by other gates 218a and 218b made of another gate material.

For said variant, the sacrificial gates 108a, 108b may be formed of a semi-conductor material, for example such as polysilicon.

The replacement of the gates 108a, 108b may be carried out by deposition of another gate material 218, such as a metal or a stacking of several metals. This may be carried out by deposition then removal of any excess by chemical mechanical polishing with stoppage on the layer of dielectric material 133.

Said embodiment variant is carried out after the formation of the silicided areas and may lead to a redistribution of the strains preferentially at the level of the channel areas of the transistors T1 and T2.

Figure 4A:
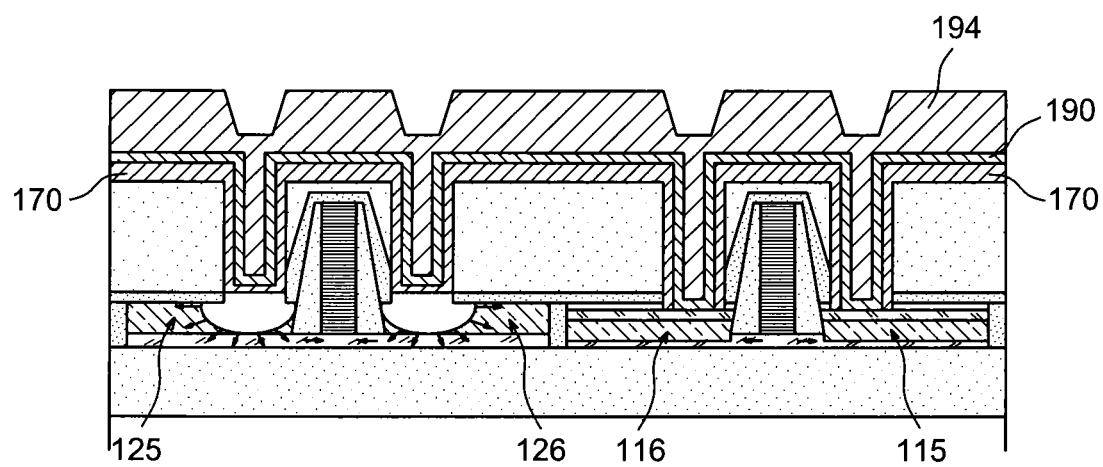
FIGS. 4A-4B illustrate a variant of method during which the metal deposited after silicidation is conserved.
Figure 4B:
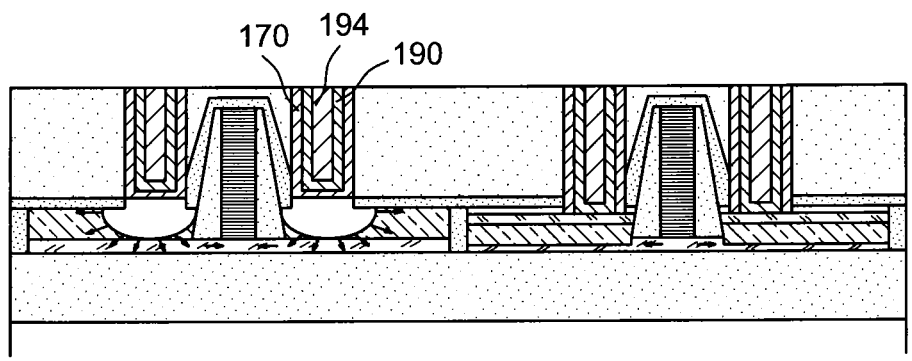

Another embodiment variant is given in FIGS. 4A-4B.

For said variant, the metal 170 deposited in the openings 141, 143, 145, 147 to carry out a silicidation of the semi-conductor areas 115, 116, 125, 126, is conserved.

A diffusion barrier layer 190, for example based on TaN or TiN and of a thickness comprised for example between 1 nm and 10 nm, is then deposited. Then, a metallic material 194 such as for example tungsten, or copper is deposited in order to fill the openings 141, 143, 145, 147 (FIG. 4A).

Then, the layers of metal 170, barrier 190 and metallic material 194 are removed from the surface of the layer of dielectric material for example by chemical mechanical polishing with a stoppage on the dielectric (FIG. 4B).

A variant of the example of method that has been described previously with reference to FIGS. 2A-2K is given in FIGS. 5A-5D and 6.

For said variant, the sacrificial layer 118 is formed by deposition so as to cover the gate 108b of the second transistor $T_2$.

Figure 5A:
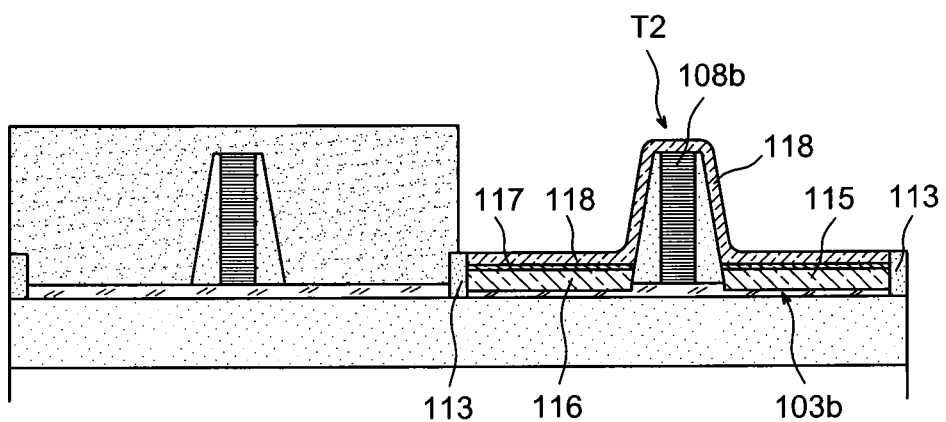
FIGS. 5A-5D and 6 illustrate a variant of method of producing a microelectronic device according to the invention in which a strain layer is deposited on transistors of different types, at least one transistor being covered beforehand with a sacrificial layer covering its source and drain areas as well as its gate.

The material of the sacrificial layer 118 is also a material chosen so as to be able to be etched selectively vis-à-vis that of the strain layer, for example polySi or polyGe (FIG. 5A).

Figure 5B:
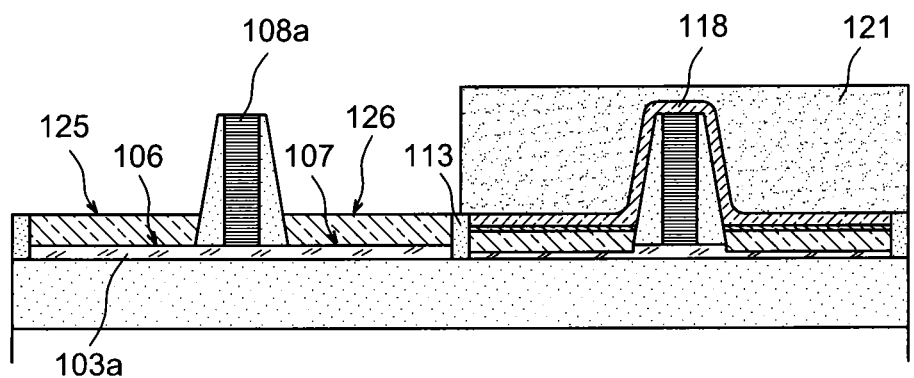
Figure 5C:
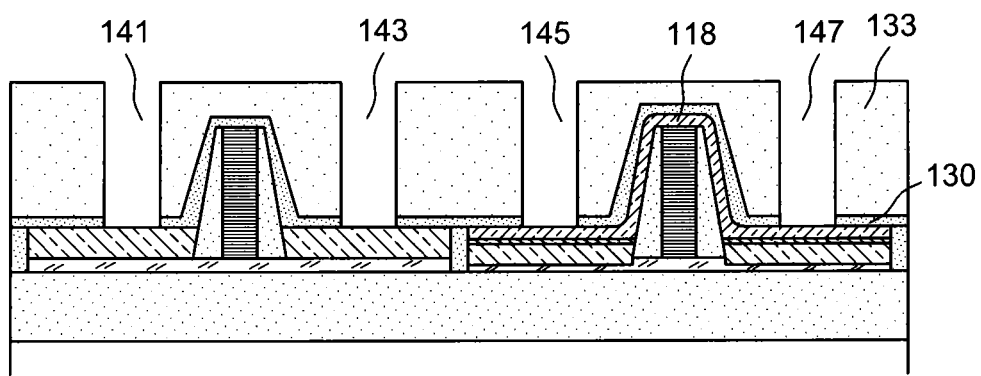

It is then possible to carry out the steps of depositing a masking layer, for example a layer of hard mask based on silicon nitride, then photolithography and etching, may be provided to form another hard mask 121 covering the second gate 108b as well as the semi-conductor areas 115, 116, whereas the first gate 108a and the first semi-conductor region 103a are for their part exposed (FIG. 5B).

Then, the layer 130 known as "strain" layer is formed, provided to exert a strain on the channel of the first transistor $T_1$.

The strain layer 130 may be deposited in a uniform manner on the gate 108a and the semi-conductor areas 125, 126, of the first transistor $T_1$, as well as the sacrificial layer 118 formed on the second transistor $T_2$.

Figure 6:
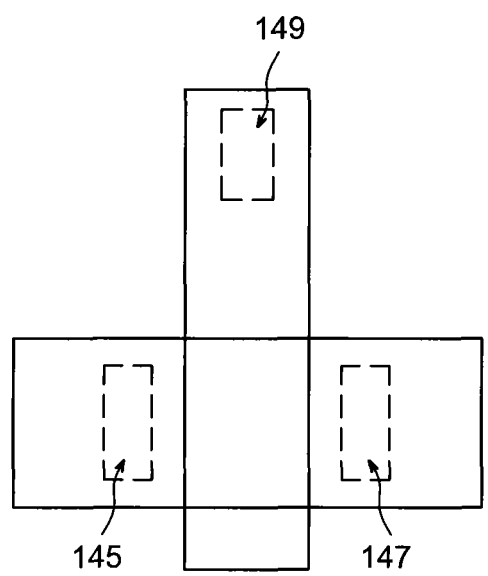

Then, a layer of dielectric material 133 (FIG. 5C) is formed in which openings 141, 143, 145, 147, 149 traversing the strain layer 130 are then formed, and which are intended to accommodate the contact pads of the first transistor $T_1$, and of the second transistor $T_2$. In FIG. 6, openings 145, 147, 149 formed respectively facing a source region, a drain region and a gate region of the second transistor T2.

Figure 5D:
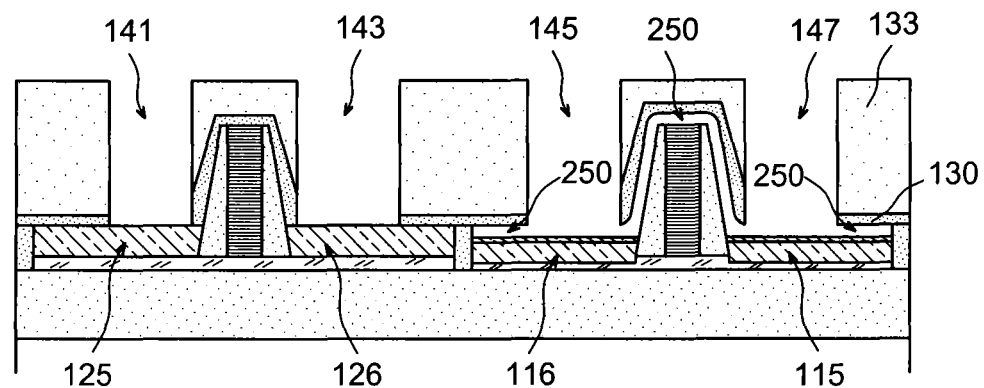

A removal of the sacrificial layer 118 is then carried out, for example by selective etching vis-à-vis the layers 130 and 133 through the openings 141, 143, 145, 147, 149. After removal, a space 250 or a cavity 250 is formed between the strain layer 130 and the second transistor $T_2$, the strain layer 130 no longer being in contact with a layer covering the second transistor $T_2$. Said removal thus makes it possible to release the strain exerted by the strain layer 130 on the second transistor $T_2$ (FIG. 5D).

The invention claimed is:

1. A method of producing a microelectronic device with transistors comprising the steps of:
   a) forming a strain layer on a first gate block of a transistor of a first type and on first semi-conductor areas situated on either side of said first gate block, as well as on a second gate block of a transistor of a second type and on second semi-conductor areas situated on either side of said second gate block, a sacrificial layer being provided between said strain layer and said second semi-conductor areas of the transistor of the second type,
   b) forming openings traversing the strain layer among which one or more given openings exposing the sacrificial layer,
   c) removing the sacrificial layer by etching through said openings.

2. The method according to claim 1, wherein among the openings formed at step b) one or more openings revealing the first semi-conductor areas.

3. The method according to claim 2, the method moreover comprising, after step c), the deposition of a metallic material through said openings, followed by an annealing, so as to form areas of alloy of metal and semi-conductor.

4. The method according to claim 3, wherein the type of metallic material deposited, the volume of metallic material deposited on the first semi-conductor areas, as well as the duration of the annealing are chosen so as to form first areas of alloy of metal and semi-conductor exerting a compressive strain on a channel area of said transistor of the first type.

5. The method according to claim 3, wherein the removal of the sacrificial layer by etching through said given openings leads to the formation of cavities between said second semi-conductor areas and said strain layer, said metallic deposition and said annealing being carried out so as to form second areas of alloy of metal and semi-conductor partially filling said cavities, a space being conserved between said second areas of alloy of metal and semi-conductor and said strain layer.

6. The method according to claim 1, wherein the first gate block and the second gate block rest on a semi-conductor layer, the first semi-conductor areas and/or the second semi-conductor areas being formed by growth on said semi-conductor layer.

7. The method according to claim 6, the method moreover comprising, prior to said growth: a thinning of said semi-conductor layer in areas situated on either side of said first gate block and/or of said second gate block.

8. The method according to claim 6, the first semi-conductor areas being formed of a semi-conductor material provided to compressive strain said semi-conductor layer on which said first gate block rests.

9. The method according to claim 6, the second semi-conductor areas being formed of a semi-conductor material provided to tensile strain said semi-conductor layer on which said second gate block rests.

10. The method according to claim 1, wherein prior to step a), insulating spacers are formed against said first gate block and said second gate block, said strain layer resting on said spacers.

11. The method according to claim 1, wherein the strain layer is separated from said second semi-conductor areas by an etching stop layer, the removal at step c) of the sacrificial layer by etching through said given openings being carried out until reaching said etching stop layer.

12. The method according to claim 1, wherein the strain layer is based on a dielectric material such as silicon nitride.

13. The method according to claim 1, moreover comprising between step a) and step b), the steps of:
   depositing at least one insulating layer on the strain layer,
   forming holes traversing said insulating layer and exposing said strain layer by selective etching of said insulating layer vis-à-vis said strain layer.

14. The method according to claim 1, wherein the first gate block and/or said second gate block are based on at least one sacrificial material, the method moreover comprising, after step c), the steps of:
- removing the strain layer on said first gate block and/or on said second gate block so as to expose said sacrificial material,
- removing said sacrificial material,
- replacing said sacrificial material by at least one other gate material.

* * * * *